United States Patent [19]

Hallford

[11] 4,367,560
[45] Jan. 4, 1983

[54] LOW FREQUENCY CONVERTER WITH DIODE QUAD MIXER

[75] Inventor: Ben R. Hallford, Wylie, Tex.

[73] Assignee: Rockwell International Corporation, El Segundo, Calif.

[21] Appl. No.: 243,663

[22] Filed: Mar. 13, 1981

[51] Int. Cl.³ .............................................. H04B 1/26
[52] U.S. Cl. .................................. 455/330; 455/332; 332/43 B
[58] Field of Search ....................... 455/326, 330–333; 329/163; 332/24, 43 B; 333/25; 363/159

[56] References Cited

U.S. PATENT DOCUMENTS

| | | | |
|---|---|---|---|
| 2,377,858 | 6/1945 | Bennett | 332/43 B |
| 2,455,732 | 12/1948 | Carter | 332/43 B |
| 2,545,250 | 3/1951 | Appert | 332/43 B |
| 2,820,949 | 1/1958 | Hey | 332/43 B |
| 4,186,352 | 1/1980 | Hallford | 455/330 |

Primary Examiner—Jin F. Ng
Attorney, Agent, or Firm—Michael E. Taken; Bruce C. Lutz; Howard R. Greenberg

[57] ABSTRACT

A low frequency, diode quad mixer is provided in combination with simple, compact transformer circuitry. A diode quad mixer bridge interconnects the secondary winding of a single transformer and the four secondary windings of a pair of dual transformers. The combination affords isolation between the signals coupled through each of the transformers, and may be implemented as an up converter or a down converter.

8 Claims, 1 Drawing Figure

LOW FREQUENCY CONVERTER WITH DIODE QUAD MIXER

TECHNICAL FIELD

The invention relates to low frequency diode quad mixers and associated circuitry for up or down conversion between transformer coupled signals.

BACKGROUND AND SUMMARY

Diode quad mixers are well known in the art. The mixer performs up or down conversion between different frequency input signals. The frequencies which are output from the mixer are the modulation products which exist according to the heterodyne principle by which the mixer operates, wherein a pair of signals are applied to a nonlinear element such as a diode.

The present invention relates to low frequency diode quad mixers wherein the signal frequencies are low enough to permit coupling through transformer windings. Transformers are inherently bulky and costly to implement. The present invention evolved from efforts to provide simple, compact and low cost transformer circuitry in combination with a diode quad mixer.

DETAILED DESCRIPTION

Figure 1:
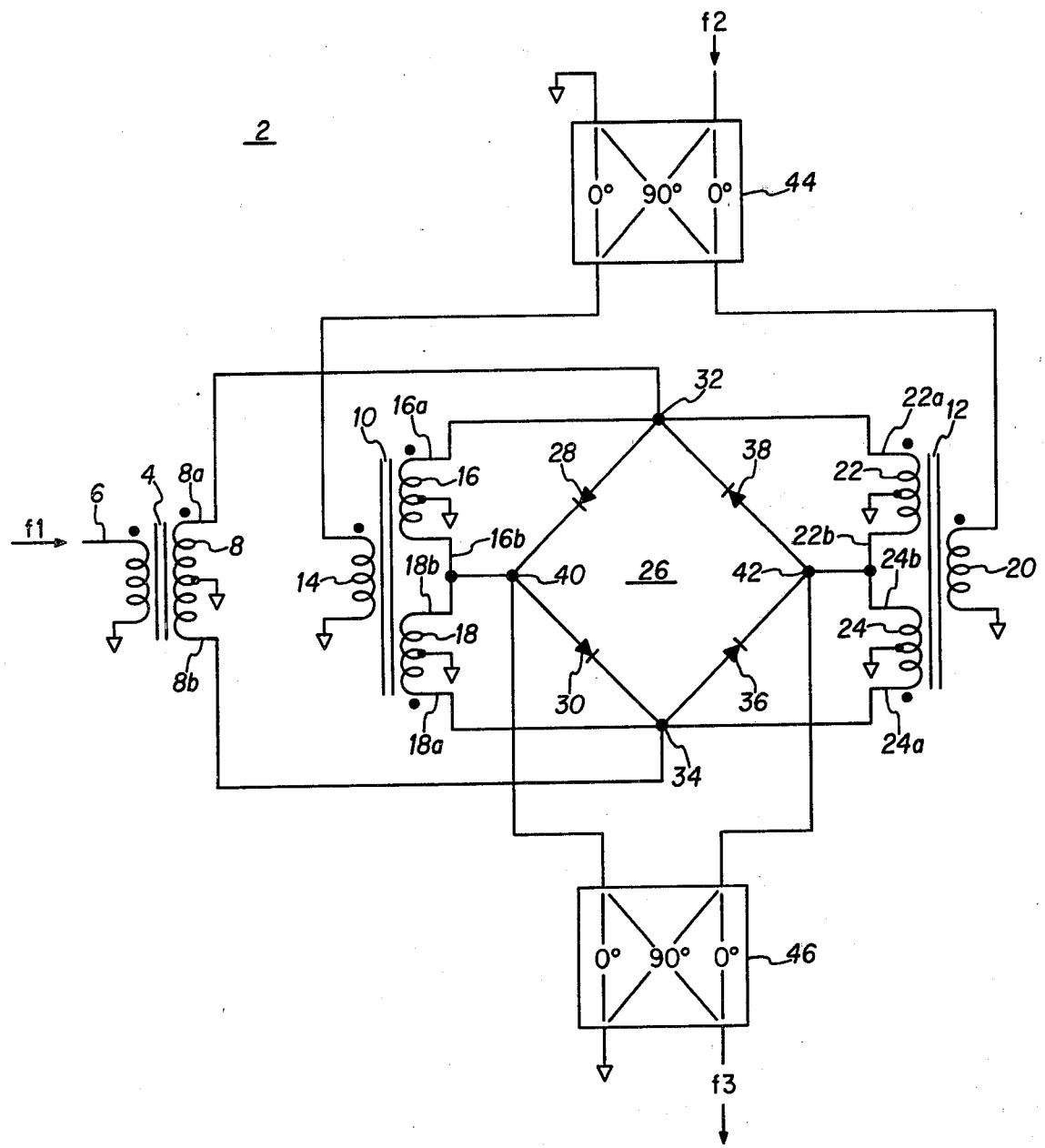
FIG. 1 is a schematic circuit diagram of a low frequency diode quad mixer frequency converter constructed in accordance with the invention.

Frequency converter 2 has a first transformer 4 with a primary winding 6 and a secondary winding 8. Frequency converter 2 also has a pair of dual transformers 10 and 12. The first dual transformer 10 has a primary winding 14 and a pair of secondary windings 16 and 18. The second dual transformer 12 has a primary winding 20 and a pair of secondary windings 22 and 24. A diode quad mixer bridge 26 interconnects secondary windings 8, 16, 18, 22 and 24 for heterodyne modulation product signal generation.

Diode quad 26 has a first circuit branch with a pair of commonly poled diodes 28 and 30 connected in series between points 32 and 34 across the secondary winding 8 of transformer 4. Diode quad 26 has a second circuit branch with a pair of commonly poled diodes 36 and 38 connected in series between points 34 and 32 across the secondary winding 8 of transformer 4. The first and second circuit branches of the diode quad are connected in parallel between points 32 and 34 and oppositely poled.

The four secondary windings 16, 18, 22 and 24 of the dual transformers are connected across a respective one of the four diodes 28, 30, 38 and 36. One end of secondary winding 16 and one end of secondary winding 18 are connected in common to a point 40 between diodes 28 and 30. The other end of secondary winding 16 is connected to one end of secondary winding 8. The other end of secondary winding 18 is connected to the other end of secondary winding 8. The ends 16b and 18b of secondary windings 16 and 18 connected to point 40 have the same polarity. The other end 16a of secondary winding 16 is connected through point 32 to the end 8a of secondary winding 8 having the same polarity. The other end 18a of secondary winding 18 is connected through point 34 to the end 8b of secondary winding 8 of opposite polarity. The pair of secondary windings 16 and 18 of dual transformer 10 are thus connected across diodes 28 and 30 which are in series across secondary winding 8 of transformer 4.

One end of secondary winding 22 and one end of secondary winding 24 are connected in common to a point 42 between diodes 36 and 38. The other end of secondary winding 22 is connected to one end of secondary winding 8. The other end of secondary winding 24 is connected to the other end of secondary winding 8. The ends 22b and 24b of secondary windings 22 and 24 connected to point 42 have the same polarity. The other end 22a of secondary winding 22 is connected through point 32 to the end 8a of secondary winding 8 having the same polarity. The other end 24a of secondary winding 24 is connected through point 34 to the end 8b of secondary winding 8 of opposite polarity. The pair of secondary windings 22 and 24 of dual transformer 12 are thus connected across diodes 36 and 38 which are in series across secondary winding 8.

When converter 2 is implemented as a down converter, an input signal of frequency f1 is input through transformer 4, and a second input signal of lower frequency f2 is input through 90° quadrature hybrid −3 db coupler 44 and dual transformers 10 and 12. The diode quad 26 mixes the f1 and f2 signals, resulting in heterodyne modulation product signal generation, including an output signal having a frequency f3, which is the difference between f1 and f2, output through 90° quadrature hybrid −3 dB coupler 46.

When converter 2 is implemented as an up converter, the diode quad mixes input signals f2 and f3 which are input respectively from couplers 44 and 46. This results in an output signal f1 induced on winding 6.

The invention provides isolation between the f1 signal in transformer 4 and the f2 signal in transformers 10 and 12. The f2 signal coupled through transformer 10 to end leads 16b and 18b and to point 40 sees the same effective potential drop across each of diodes 28 and 30 because respective diode connection points 32 and 34 are at substantially the same potential reference level relative to f2 signals because of their connection to the other ends 16a and 18a of windings 16 and 18. Thus, no net potential is induced between leads 8a and 8b from the f2 signals on point 40, i.e., an f2 signal on point 40 sees the same potential drop to each of leads 8a and 8b and thus does not induce any new or additional net potential therebetween. The f1 signal in transformer 4 is thus ioslated from the f2 signal in transformer 10.

The f2 signal coupled through transformer 12 to end leads 22b and 24b and to point 42 sees the same effective potential drop across each of diodes 38 and 36 because respective diode connection points 32 and 34 are at substantially the same potential reference level relative to f2 signals because of their connection to the other ends 22a and 24a of windings 22 and 24. Thus, no net potential is induced between leads 8a and 8b from the f2 signals on point 42, i.e., an f2 signal on point 42 sees the same potential drop to each of leads 8a and 8b and thus does not induce any new or additional net potential therebetween. The f1 signal in transformer 4 is thus isolated from the f2 signal in transformer 12.

The f2 signal in transformers 10 and 12 is likewise isolated from the f1 signal in transformer 4. The f1 signal from lead 8a and connection point 32 flows through diode 28 and then through diode 30 to connection point 34 and to lead 8b. Leads 8a and 8b are each other's reference points, and hence the voltage on connection point 32 is referenced to connection point 34 and lead 8b, not to lead 18a or 24a. The f1 signal from connection point 32 flows through diode 28 toward point 40, and then through diode 30 away from point 40, such that leads 16b and 18b and point 40 see opposite polarities (voltages which are 180° out of phase), and hence no new or additional net voltage is induced on point 40 and windings 16 and 18 from the f1 signal.

The f1 signal from lead 8b and connection point 34 flows through diode 36 and then through diode 38 to connection point 32 and to lead 8a. Leads 8b and 8a are each other's reference points, and hence the voltage on connection point 34 is referenced to connection point 32 and lead 8a, not to lead 22a or 16a. The f1 signal from connection point 34 flows through diode 36 toward point 42, and then through diode 38 away from point 42, such that leads 22b and 24b and point 42 see opposite polarities (voltages which are 180° out of phase), and hence no new or additional net voltage is induced on point 42 and windings 22 and 24 from the f1 signal. The f2 signals in transformers 10 and 12 are thus isolated from the f1 signal in transformer 4.

The diode quad may be provided in a loop configuration (ring modulator) as shown, or in its electrically equivalent cross-connected configuration (lattice modulator).

It is recognized that various modifications are possible within the scope of the appended claims.

I claim:

1. A frequency converter comprising, in combination:
   a first transformer having a primary winding and a secondary winding means;
   a pair of dual transformers, each having a primary winding and a pair of series connected secondary winding means; and
   a diode mixer bridge having a diode quad, comprising only four diodes, interconnecting said secondary winding means of said first and said pair of transformers for heterodyne modulation product signal generation.

2. The invention according to claim 1 wherein said diode quad is connected across said secondary winding means of said first transformer.

3. The invention according to claim 2 wherein each of said secondary winding means of said dual transformers is connected across a respective one of the diodes in said diode quad.

4. The invention according to claim 3 wherein:
   said pair of secondary winding means of the first of said dual transformers is connected across a first pair of said diodes which are commonly poled and in series across said secondary winding means of said first transformer; and
   said pair of secondary winding means of the second of said dual transformers is connected across a second pair of said diodes which are commonly poled and in series across said secondary winding means of said first transformer, said first and second pairs of diodes being oppositely poled and connected in parallel.

5. The invention according to claim 1 wherein:
   said diode quad comprises a first branch having a pair of commonly poled diodes connected in series across said secondary winding means of said first transformer, and a second branch having a pair of commonly poled diodes connected in series across said secondary winding means of said first transformer, said branches being connected in parallel and oppositely poled;
   the first of said dual transformers has one end of each of its first and second secondary winding means connected in common to a point between the diodes in said first diode pair branch; and
   the second of said dual transformers has one end of each of its first and second secondary winding means connected in common to a point between the diodes in said second diode pair branch.

6. The invention according to claim 5 wherein:
   the other ends of said first and second secondary winding means of said first dual transformer are connected to respective opposite ends of said secondary winding means of said first transformer; and
   the other ends of said first and second secondary winding means of said second dual transformer are connected to respective opposite ends of said secondary winding means of said first transformer.

7. The invention according to claim 6 wherein:
   the same polarity said one ends of said first and second secondary winding means of said first dual transformer are connected to said point between said diodes in said first diode pair branch;
   the same polarity said one ends of said first and second secondary winding means of said second dual transformer are connected to said point between said diodes in said second diode pair branch;
   said other end of said first secondary winding means of said first dual transformer is connected to the same polarity end of said secondary winding means of said first transformer;
   said other end of said second secondary winding means of said first dual transformer is connected to the opposite polarity end of said secondary winding means of said first transformer;
   said other end of said first secondary winding means of said second dual transformer is connected to the same polarity end of said secondary winding means of said first transformer; and
   said other end of said second secondary winding means of said second dual transformer is connected to the opposite polarity end of said secondary winding means of said first transformer.

8. A frequency converter comprising in combination:
   a first transformer having a primary winding and a secondary winding;
   a diode quad mixer bridge having a first branch with a pair of commonly poled diodes connected in series across said secondary winding of said first transformer, and a second branch having another pair of commonly poled diodes connected in series across said secondary winding of said first transformer, said first and second branches being oppositely poled and connected in parallel;
   a first dual transformer having a primary winding and a pair of secondary windings, the same polarity ends of said pair of secondary windings being connected in common to a point between said diodes in said first branch, the other ends of said pair of secondary windings being connected to a respective one of the ends of said secondary winding of said first transformer; and
   a second dual transformer having a primary winding and a pair of secondary windings, the same polarity ends of said pair of secondary windings of said second dual transformer being connected in common to a point between said diodes in said second branch, the other ends of said pair of secondary windings of said second dual transformer being connected to a respective one of the ends of said secondary winding of said first transformer;

such that f1 signals coupled through said first transformer are isolated from f2 signals coupled through said dual transformer because of equal potential drops from said common points across each of said diodes relative to f2 signals;

and such that f2 signals coupled through said dual transformers are isolated from f1 signals coupled through said first transformer due to opposite voltage polarity toward and away from said common points relative to f1 signals.

* * * * *